(12) United States Patent
Martin et al.

(10) Patent No.: US 6,628,168 B2
(45) Date of Patent: Sep. 30, 2003

(54) MULTIPLE INPUT, FULLY DIFFERENTIAL, WIDE COMMON-MODE, FOLDED-CASCODE AMPLIFIER

(75) Inventors: Aaron K. Martin, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 09/896,193

(22) Filed: Jun. 28, 2001

(65) Prior Publication Data

US 2003/0006841 A1 Jan. 9, 2003

(51) Int. Cl.[7] .................................................. H03F 3/45
(52) U.S. Cl. ........................ 330/253; 330/257; 330/261
(58) Field of Search ................................ 330/253, 257, 330/261

(56) References Cited

U.S. PATENT DOCUMENTS 5,745,007 A * 4/1998 Redman-White ............ 330/253
6,043,708 A * 3/2000 Barr .......................... 330/253

OTHER PUBLICATIONS

Roewer Et Al. "A Novel Class of Complementary Folded-Cascode Opamps for Low Voltage" IEEE Journal of Solid-State Circuits vol. 37 Issue of 8 Aug. 2002 pp 1080–1083.*

W. Dally and J. Poulton, Cambridge University Press, Digital Systems Engineering, 1998, p. 369.

IEEE Journal Of Solid State Control Circuits, vol. 26, No. 2, Feb. 1991, Two Novel Fully Complementary Self Biased CMOS Differential Amplifiers, pp. 165–168.

* cited by examiner

*Primary Examiner*—Michael B Shingleton
(74) *Attorney, Agent, or Firm*—Seth Z. Kalson

(57) ABSTRACT

A multiple input, fully differential amplifier. Embodiments make use of complementary differential transistors pairs connected with cascode transistors to form folded cascode pairs, to achieve wide common mode range, high common mode rejection, and high gain.

16 Claims, 2 Drawing Sheets

MULTIPLE INPUT, FULLY DIFFERENTIAL, WIDE COMMON-MODE, FOLDED-CASCODE AMPLIFIER

FIELD

Embodiments of the present invention relate to analog circuits, and more particularly, to analog amplifier circuits with multiple inputs.

BACKGROUND

Differential amplifiers are ubiquitous building blocks in many analog systems. Many applications require linear amplification of multiple differential input voltages by a single amplifier, where addition and subtraction are some of the general functions performed on the multiple input voltages. Such summing and differencing functions find applications in analog filters and bi-directional signaling receivers, to name just a couple.

A prior art differential amplifier circuit for two differential input voltages is shown in FIG. 1. Input ports 102A and 102B comprise a first differential input port pair for receiving a first differential input voltage, and input ports 104A and 104B comprise a second differential input port pair for receiving a second differential input voltage. A differential output voltage is provided by output ports 106A and 106B.

Transistors 102A and 102B are nMOSFETs (Metal Oxide Semiconductor Field Effect Transistor) comprising a first differential pair, and nMOSFETs 104A and 104B comprise a second differential pair. Current sink 108 sinks bias currents from nMOSFETs 102A and 102B, and current sink 110 sinks bias currents from nMOSFETs 104A and 104B. A load 112 is connected to the drains of nMOSFETs 102A and 104A, and load 114 is connected to the drains of nMOSFETs 102B and 104B. These loads may be active loads.

The circuit of FIG. 1 may easily be generalized to an arbitrary number of differential input port pairs, and may be used for performing summation or differencing. However, for demanding applications the circuit of FIG. 1 may suffer from limited input common mode voltage range, limited common mode rejection, and low gain.

DESCRIPTION OF EMBODIMENTS

Figure 2:
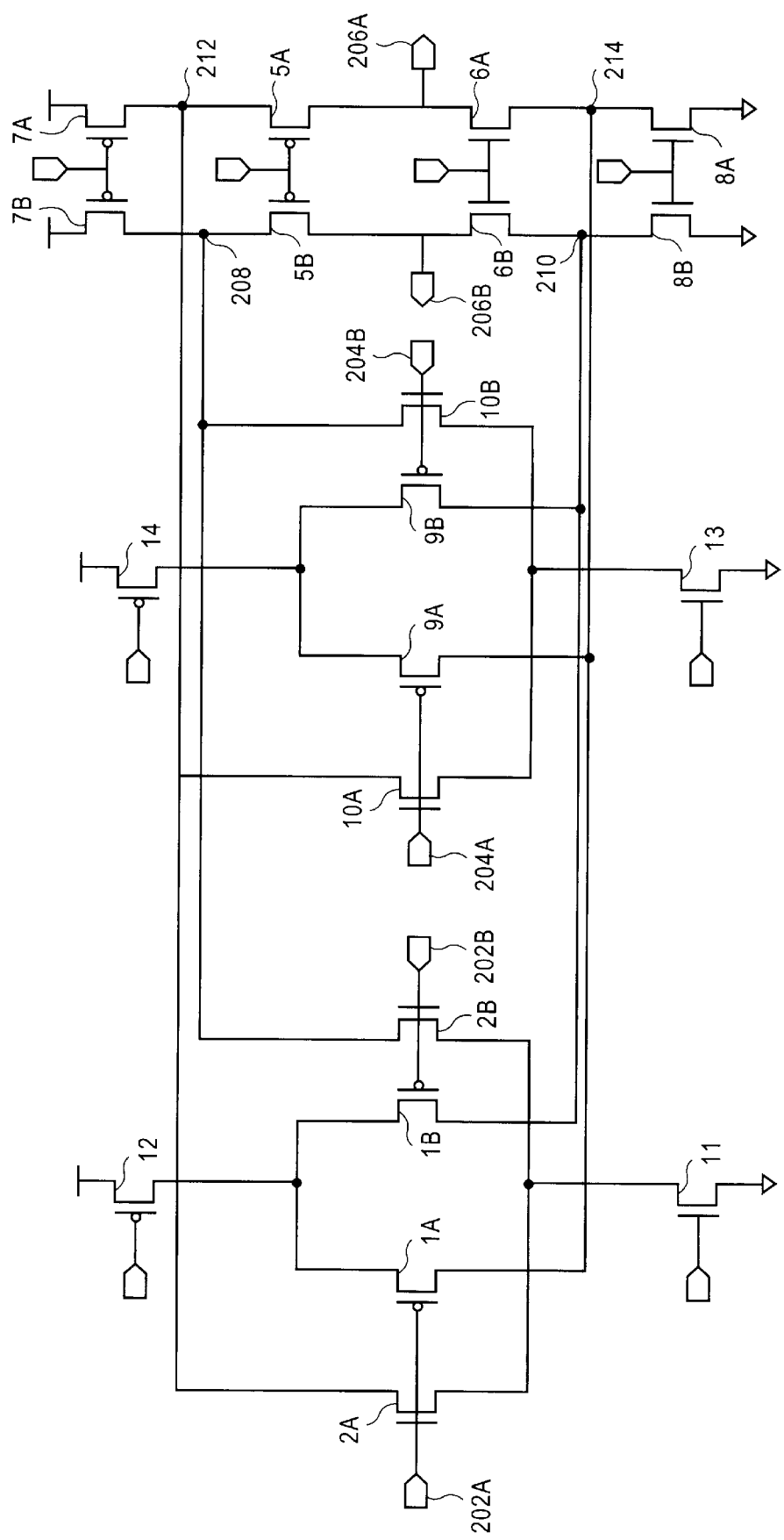
FIG. 2 is a multiple input, fully differential amplifier according to an embodiment of the present invention.

FIG. 2 is a circuit for a fully differential, multiple input amplifier. The output is provided at differential output port pair 206A and 206B. For simplicity, the circuit of FIG. 2 comprises only two differential input port pairs, one differential input port pair comprising 202A and 202B, and another differential input port pair comprising 204A and 204B. However, generalizations of circuit of FIG. 2 to an arbitrary number of differential input port pairs should be clear to one of ordinary skill in analog circuits, as will be discussed later.

The differential amplifier of FIG. 2 may be considered a transconductance amplifier, in that a small-signal current is provided to one or more loads in response to differential voltages at input port pair 202A and 202B, and input port pair 204A and 204B, where one load may be taken as the output resistance looking into transistor 5A in parallel with transistor 6A, and another load may be taken as the output resistance looking into transistor 5B in parallel with transistor 6B.

Transistors 1A and 1B are pMOSFETs arranged as a differential pair of transistors having their sources connected to each other, and transistors 2A and 2B are nMOSFETs arranged as a differential pair having their sources connected to each other. These two differential pairs are complementary to each other in that they comprise transistors having complementary carrier types, i.e., transistors 1A and 1A are of p-carrier type and transistors 2A and 2B are of n-carrier type. The gates of transistors 1A and 2A are connected to input port 202A, and the gates of transistors 1B and 2B are connected to input port 202B.

Similarly, transistors 9A and 9B are pMOSFETs arranged as a differential pair of transistors having their sources connected to each other, and transistors 10A and 10B are nMOSFETs arranged as a differential pair having their sources connected to each other. These two differential pairs are also seen to be complementary to each other. The gates of transistors 9A and 10A are connected to input port 204A, and the gates of transistors 9B and 10B are connected to input port 204B.

Figure 1:
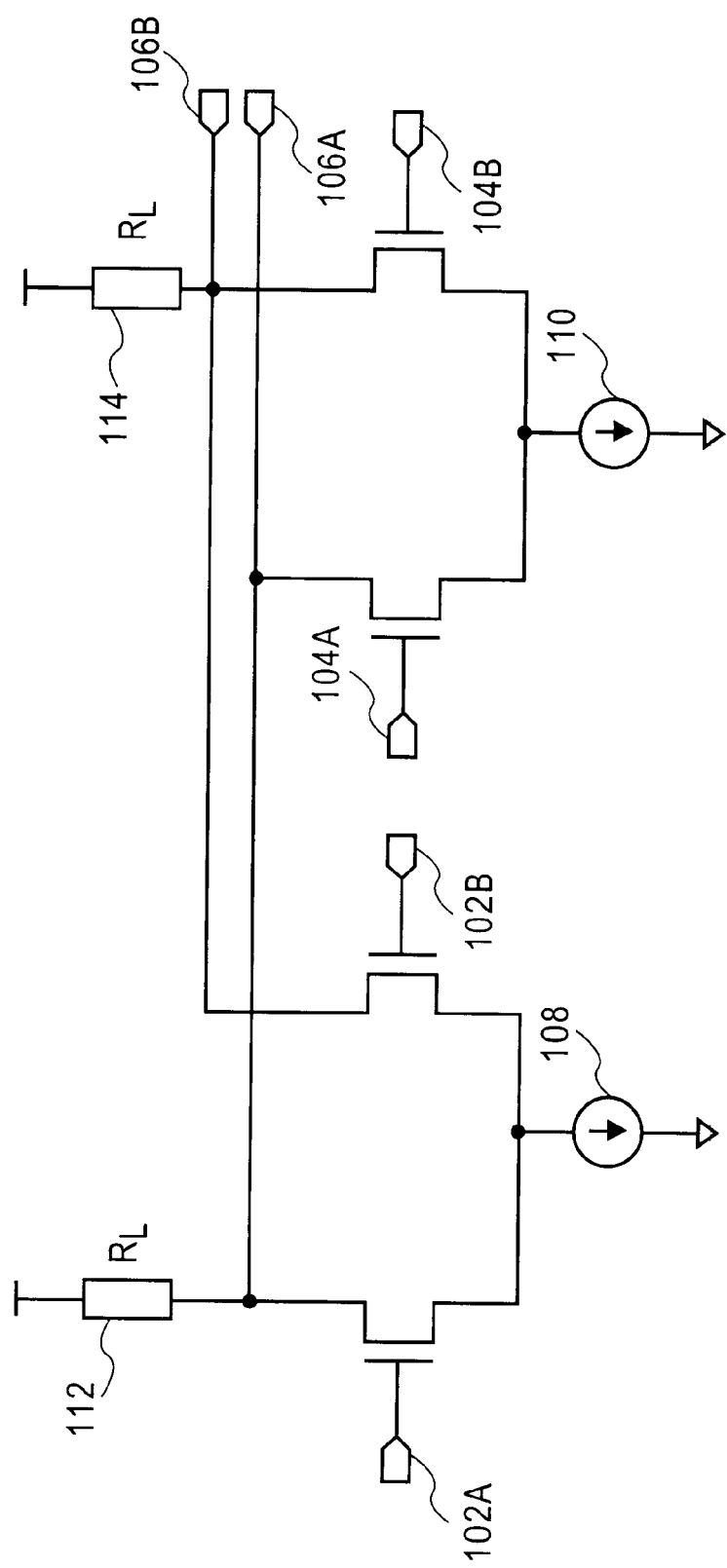
FIG. 1 is a prior art multiple input, differential amplifier circuit.

The complementary arrangement of the amplifier of FIG. 1 provides for a very wide common mode range of operation, as reasoned as follows. Considering differential input port pair 202A and 202B, if the common mode input voltage is low such that transistors 2A and 2B are in cut-off, then transistors 1A and 1A will still be ON and will continue to amplify. Conversely, if the common mode input voltage is high such that transistors 1A and 1A are in cut-off, then transistors 2A and 2B will still be ON and will continue to amplify. Similar reasoning applies to differential input port pair 204A and 204B. In this way, the amplifier of FIG. 1 will provide amplification over a wide common mode input voltage range.

Transistor 12 sources bias current to differential pair 1A and 1A, and transistor 14 sources bias current to differential pair 9A and 9B. Transistors 8A and 8B comprise a current mirror with their gates connected to each other. However, other embodiments may be realized in which these gates are biased to different voltages, so that transistors 8A and 8B may not necessarily be current mirrors. Transistor 8A sinks bias currents from transistors 1A, 9A, and 6A, and transistor 8B sinks bias currents from transistors 1B, 9B, and 6B.

Transistor 11 sinks bias current from differential pair 2A and 2B, and transistor 13 sinks bias current from differential pair 10A and 10B. Transistors 7A and 7B comprise a current mirror with their gates connected to each other, but as discussed for transistors 8A and 8B, other embodiments may have the gates of transistors 7A and 7B biased to different voltages. Transistor 7A sources bias currents to transistors 2A, 10A, and 5A, and transistor 7B sources bias currents to transistors 2B, 10B, and 5B.

The gates of transistors 7A, 7B, 12, and 14 are biased so that these transistors are ideally in saturation. In some embodiments, these gates may be biased to the same bias voltage. In other embodiments, the gates of transistors 12 and 14 may be biased to different voltages. Similar statements apply to transistors 8A, 8B, 11, and 13.

Transistors 2B and 5B are arranged as a folded-cascode pair. Transistor 5B is a pMOSFET, so that the folded-cascode pair 2B and 5B is comprised of transistors having complementary carrier types. Cascode transistor 5B provides impedance translation. That is, the impedance at node 208 is very much smaller than the impedance seen at output port 206B when looking into the amplifier. Similarly, transistors 1B and 6B are arranged as a folded-cascode pair with complementary carrier types, where the impedance at node 210 is much smaller than the impedance seen at output port 206B.

Transistors 2A and 5A, and transistors 1A and 6A, are also arranged as folded-cascode pairs having complementary carrier types, and impedance translation is provided so that the impedances at nodes 212 and 214 are much smaller than the impedance seen by output port 206A when looking into the amplifier.

Likewise, transistors 10B and 5B, transistors 9B and 6B, transistors 10A and 5A, and transistors 9A and 6A, are also arranged as folded-cascode pairs, each having complementary carrier types.

In the particular embodiment of FIG. 2, the gates of cascode transistors 5A and 5B are connected to each other, and are biased to some voltage, and the gates of cascode transistors 6A and 6B are connected to each other, and are biased to some voltage. Other embodiments may be realized with different biasing schemes. For example, each cascode may be biased to a different bias voltage, or they may all be biased to the same bias voltage.

By connecting the drains of transistors 1A and 9A to node 214, the drains of transistors 1A and 9B to node 210, the drains of transistors 2A and 10A to node 212, and the drains of transistors 2B and 10B to node 208, a summing function on the differential input voltages may be realized. This summing may not be of equal weighting, depending upon the relative sizes (gains) of the transistors and the various bias currents and voltages.

For example, suppose a small-signal voltage $V_1(+)$ is applied at input port 202A and a small-signal voltage $V_1(-)$ is applied at input port 202B, where ideally these small-signal voltages are with respect to the same common mode voltage so that $V_1(+)=-V_1(-)$. Similarly, suppose the small-signal voltages applied at input ports 204A and 204B are, respectively, $V_2(+)$ and $V_2(-)$, where again these small-signal voltage are ideally with respect to the same common mode voltage (not necessarily the same as the common mode voltage for input port pair 202A and 202B) so that $V_2(+)=-V_2(-)$. Then, the small-signal voltage at output port 206B will in general be approximately of the form $A_1V_1(+)+A_2V_2(+)$ and the small-signal voltage at output port 206A will in general be approximately of the form $B_1V_1(-)+B_2V_2(-)$, where $A_1$, $A_2$, $B_1$, and $B_2$ are, to a first approximation, independent of the input voltages. These constants may be of various values, depending upon how the various transistors are biased and sized.

The transistors may be sized and the various transistors may be biased to realize a summing function in which $A_1=B_1$ and $A_2=B_2$, so that the difference in voltage between output ports 206B and 206A may be expressed as the weighted sum of differences $A_1\Delta_1+A_2\Delta_2$, where $\Delta_1=V_1(+)-V_1(-)$ and $\Delta_2=V_2(+)-V_2(-)$. Furthermore, a sizing and biasing scheme may be chosen to realize a summing function in which $A_1=B_1=A_2=B_2$, so that the difference in voltage between output ports 206B and 206A may be expressed as $A_1(\Delta_1+\Delta_2)$.

To realize a differencing function, the roles of one of the differential input port pairs may be interchanged. That is, the voltage $V_2(+)$ may be applied to input port 204B and the voltage $V_2(-)$ may be applied to input port 204A, so that for the last example in which $A_1=B_1=A_2=B_2$, the function $A_1(\Delta_1-\Delta_2)$ is realized. There is no fundamental distinction between a summing function and a differencing function, so that both may be referred to as a summing function.

It should be appreciated that additional input port pairs and associated differential pairs of transistors may be added to the circuit of FIG. 2. For example, to realize a three input amplifier, another differential pair of pMOSFETs may be added with the drain of one connected to node 210 and the drain of the other connected to node 214, and a complementary differential pair of nMOSFETs added with the drain of one connected to node 208 and the drain of the other connected to 212, where the gates are connected to a differential input port pair in like manner as done for the other differential input pairs.

The use of folded-cascode pairs provides high output impedance, which helps to provide a high amplifier gain because gain is determined by the product of the input transconductance and the output impedance. This may be demonstrated as follows, where for simplicity only one set of input differential pairs is considered, comprising transistors 1A, 1B, 2A, and 2B.

The gain a of the amplifier is given by $$a=g_m r_{out}, \qquad (2)$$

where $g_m$ is the amplifier transconductance and $r_{out}$ is the amplifier small-signal output resistance at an output port looking into the amplifier. For simplicity of discussion, we restrict the derivation below to output port 206B. But similar results also apply to output port 206A. The amplifier output resistance at output port 206B is equal to the combination of the small-signal output resistance at output port 206B when transistor 6B is open-circuited in parallel with the small-signal output resistance at output port 206B when transistor 5B is open-circuited. Denoting the former and latter output resistances, respectively, as $r_{out5}$ and $r_{out6}$, the amplifier output resistance at output port 206B may be expressed as $$r_{out}=r_{out5}\|r_{out6}. \qquad (3)$$

An approximate expression for the output resistance $r_{out5}$ may be derived as follows. Let $v_{out}$ denote the small-signal output voltage at output port 206B, and let $i_{out}$ denote the small-signal current at output port 206B in the direction looking into the amplifier. Let $v_{s5}$ denote the small-signal voltage at the source (node 208) of transistor 5B, let $r_{ds5}$ denote the drain-source resistance of transistor 5B, and let $g_{m5}$ denote the transconductance of transistor 5B. The small-signal gate-to-source voltage of transistor 5B is equal to the negative of $v_{s5}$. The low-frequency small-signal equivalent circuit for transistor 5B with $-v_{s5}$ substituted for the small-signal gate-to-source voltage of transistor 5B yields $$i_{out} = -g_{m5} v_{s5} + \frac{v_{out} - v_{s5}}{r_{ds5}}. \qquad (4)$$

Let $r_{ds2}$ denote the drain-source resistance of transistor 2B. Because transistor 7B may be approximated as a constant current source, the small-signal current through transistor 2B is equal to $i_{out}$. With this approximation, and the approximation that the source voltage of transistor 2B is zero, and noting that the voltage at input port 202B is held constant to compute the output resistance, the low-frequency small-signal equivalent circuit for transistor 2B yields $$i_{out} = \frac{v_{s5}}{r_{ds2}}. \tag{5}$$

Simultaneously solving equations (4) and (5) for $v_{out}$ yields $$v_{out} = \frac{v_{s5}}{r_{ds2}}(r_{ds5} + r_{ds2} + g_{m5} r_{ds5} r_{ds2}). \tag{6}$$

The output resistance $r_{out5}$ is $$r_{out5} = v_{out}/i_{out}. \tag{7}$$

Substituting into equation (7) the expression for $i_{out}$ given by equation (5) and the expression for $v_{out}$ given by equation (6) yields $$r_{out5} = r_{ds5} + r_{ds2} + g_{m5} r_{ds5} r_{ds2} \approx g_{m5} r_{ds5} r_{ds2}. \tag{8}$$

The above equation expresses the advantage of a folded-cascode pair in providing high output impedance. A similar analysis for $r_{out6}$ gives $$r_{out6} \approx g_{m6} r_{ds6} r_{ds1}, \tag{9}$$

where $g_{m6}$ and $r_{ds6}$ are the transconductance and drain-source resistance, respectively, of transistor 6B, and $r_{ds1}$ is the drain-source resistance of transistor 1A. Consequently, from equation (3) it follows that the small-signal output resistance seen at output port 206B is significantly increased by employing cascode transistors 5B and 6B, and from equation (2) it follows that the amplifier gain is significantly increased. Similar results apply to the amplifier output resistance and amplifier gain at output port 206A.

From the above description, it is seen that the embodiments of the present invention provide for a high-gain, fully differential, multiple input differential amplifier with a wide common-mode voltage range.

The embodiments described herein are only a few of the many embodiments of the present invention. Other embodiments may be realized without departing from the scope of the invention as claimed below. For example, transistors 11, 12, 13, 14, 8A, 8B, 7A, and 7B, may be viewed as current sources and sinks, so that other devices or circuits having these functions may be employed. The invention is not necessarily limited to CMOS (Complementary Metal Oxide Semiconductor) technology, so that other process technology, such as for example BiCMOS (Bipolar CMOS) may be employed.

What is claimed is:

1. An amplifier comprising:
   a first differential input port pair comprising a first input port and a second input port;
   a second differential input port pair comprising a first input port an a second input port;
   a first differential pair comprising first and second pMOSFETs, each having a gate;
   a second differential pair comprising first and second nMOSFETs, each having a gate, wherein the gates of the first pMOSFET and first nMOSFET of the first and second differential pairs, respectively, are connected to the first input port of the first differential input port pair, and the gates of the second pMOSFET and second nMOSFET of the first and second differential pairs, respectively, are connected to the second input port of the first differential input port pair;
   a third differential pair comprising first and second pMOSFETs, each having a gate;
   a fourth differential pair comprising first and second nMOSFETs, each having a gate, wherein the gates of the first pMOSFET and first nMOSFET of the third and fourth differential pairs, respectively, are connected to the first input port of the second differential input port pair, and the gates of the second pMOSFET and second nMOSFET of the third and fourth differential pairs, respectively, are connected to the second input port of the second differential input port pair;
   a first cascode transistor forming cascode folded pairs with the first pMOSFETs of the first and third differential pairs;
   a second cascode transistor forming cascode folded pairs with the second pMOSFETs of the first and third differential pairs;
   a third cascode transistor forming cascode folded pairs with the first nMOSFETs of the second and fourth differential pairs; and
   a fourth cascode transistor forming cascode folded pairs with the second nMOSFETs of the second and fourth differential pairs.

2. The amplifier as set forth in claim 1, further comprising:
   a first bias transistor to sink current from the first cascode transistor and the first pMOSFETs of the first and third differential pairs;
   a second bias transistor to sink current from the second cascode transistor and the second pMOSFETs of the first and third differential pairs;
   a third bias transistor to source current to the third cascode transistor and the first nMOSFETs of the second and fourth differential pairs; and
   a fourth bias transistor to source current to the fourth cascode transistor and the second nMOSFETs of the second and fourth differential pairs.

3. The amplifier as set forth in claim 2, the first, second, third, and fourth bias and cascode transistors each having a gate, wherein
   the gates of the first and second bias transistors are connected to each other;
   the gates of the third and fourth bias transistors are connected to each other; the gates of the first and second cascode transistors are connected to each other; and
   the gates of the third and fourth cascode transistors are connected to each other.

4. The amplifier as set forth in claim 2, further comprising:
   a fifth bias transistor to source current to the first and second pMOSFETs of the first differential pair;
   a sixth bias transistor to sink current from the first and second nMOSFETs of the second differential pair;
   a seventh bias transistor to source current to the first and second pMOSFETs of the third differential pair; and
   a eighth bias transistor to sink current to the first and second nMOSFETs of the fourth differential pair.

5. The amplifier as set forth in claim 4, the fifth, sixth, seventh, and eighth bias transistors each having a gate, wherein
   the gates of the fifth and seventh bias transistors are biased at a first bias voltage; and the gates of the sixth and eighth bias transistors biased at a second bias voltage.

6. An amplifier comprising:

a first differential input pair comprising a first input port and a second input port;

a second differential input pair comprising a first input port and a second input port;

a first differential pair comprising first and second pMOSFETs, each having a drain, a source, and a gate;

a second differential pair comprising first and second nMOSFETs, each having a drain, a source, and a gate;

a third differential pair comprising first and second pMOSFETs, each having a drain, a source, and a gate;

a fourth differential pair comprising first and second nMOSFETs, each having a drain, a source, and a gate;

a first cascode nMOSFET having a gate, a drain, and a source connected to the drains of the first pMOSFETs of the first and third differential pairs;

a second cascode nMOSFET having a gate, a drain, and a source connected to the drains of the second pMOSFETs of the first and third differential pairs;

a third cascode pMOSFET having a gate, a drain, and a source connected to the drains of the first nMOSFETs of the second and fourth differential pairs; and a fourth cascode pMOSFET having a gate, a drain, and a source connected to the drains of the second nMOSFETs of the second and fourth differential pairs.

7. The amplifier as set forth in claim 6, wherein the drains of the first cascode nMOSFET and the third cascode pMOSFET are connected to each other; and the drains of the second cascode nMOSFET and the fourth cascode pMOSFET are connected to each other.

8. The amplifier as set forth in claim 6, wherein the gates of the first pMOSFET and first nMOSFET of the first and second differential pairs, respectively, are connected to the first input port of the first differential input port pair;

the gates of the second pMOSFET and second nMOSFET of the first and second differential pairs, respectively, are connected to the second input port of the first differential input port pair;

the gates of the first pMOSFET and first nMOSFET of the third and fourth differential pairs, respectively, are connected to the first input port of the second differential input port pair; and the gates of the second pMOSFET and second nMOSFET of the third and fourth differential pairs, respectively, are connected to the second input port of the second differential input port pair.

9. The amplifier as set forth in claim 8, wherein the gates of the first and second cascode transistors are biased to a same bias voltage;

the gates of the third and fourth cascode transistors are biased to a same bias voltage;

the drains of the first cascode nMOSFET and the third cascode pMOSFET are connected to each other; and the drains of the second cascode nMOSFET and the fourth cascode pMOSFET are connected to each other.

10. The amplifier as set forth in claim 6, further comprising:

a first current sink to sink current from the first cascode transistor and the first pMOSFETs of the first and third differential pairs;

a second current sink to sink current from the second cascode transistor and the second pMOSFETs of the first and third differential pairs;

a first current source to source current to the third cascode transistor and the first nMOSFETs of the second and fourth differential pairs; and a second current source to source current to the fourth cascode transistor and the second nMOSFETs of the second and fourth differential pairs.

11. The amplifier as set forth in claim 10, wherein the first and second current sinks comprise a first current mirror; and the first and second current sources comprise a second current mirror.

12. The amplifier as set forth in claim 11, further comprising:

a third current source to source current to the first and second pMOSFETs of the first differential pair;

a third current sink to sink current from the first and second nMOSFETs of the second differential pair;

a fourth current source to source current to the first and second pMOSFETs of the third differential pair; and a fourth current sink to sink current from the first and second nMOSFETs of the fourth differential pair.

13. An amplifier to provide a differential output voltage indicative of a generalized weighted sum of first and second differential input voltages, the amplifier comprising:

a first differential input port pair having a voltage at the first differential input voltage;

a second differential input port pair having a voltage at the second differential input voltage;

a first differential pair comprising first and second transistors;

a second differential pair comprising first and second transistors; wherein the first and second differential pairs are coupled to the first differential input port pair to be responsive to the first differential input voltage;

a third differential pair comprising first and second transistors;

a fourth differential pair comprising first and second transistors; wherein the third and fourth differential pairs are coupled to the second differential input port pair to be responsive to the second differential input voltage;

a first cascode transistor to form a folded cascode pair with the first transistors of the first and third differential pairs;

a second cascode transistor to form a folded cascode pair with the second transistors of the first and third differential pairs;

a third cascode transistor to form a folded cascode pair with the first transistors of the second and fourth differential pairs; and a fourth cascode transistor to form a folded cascode pair with the second transistors of the second and fourth differential pairs.

14. The amplifier as set forth in claim 13, further comprising:

a first current sink to sink current from the first cascode transistor and the first transistors of the first and third differential pairs;

a second current sink to sink current from the second cascode transistor and the second transistors of the first and third differential pairs;

a first current source to source current to the third cascode transistor and the first transistors of the second and fourth differential pairs; and a second current source to source current to the fourth cascode transistor and the second transistors of the second and fourth differential pairs.

15. The amplifier as set forth in claim 14, further comprising:

a third current source to source current to the first differential pair;

a third current sink to sink current from the second differential pair;

a fourth current source to source current to the third differential pair; and a fourth current sink to sink current from the fourth differential pair.

16. An amplifier comprising:

a first differential input port pair;

a second differential input port pair;

a first differential pair comprising first and second pMOSFETs, each having a gate;

a second differential pair comprising first and second nMOSFETs, each having a gate, wherein the gates of the first pMOSFET and first nMOSFET of the first and second differential pairs, respectively, are coupled to the first differential input port pair, and the gates of the second pMOSFET and second nMOSFET of the first and second differential pairs, respectively, are coupled to the first differential input port pair;

a third differential pair comprising first and second pMOSFETs, each having a gate; and a fourth differential pair comprising first and second nMOSFETs, each having a gate, wherein the gates of the first pMOSFET and first nMOSFET of the third and fourth differential pairs, respectively, are coupled to the second differential input port pair, and the gates of the second pMOSFET and second nMOSFET of the third and fourth differential pairs, respectively, are coupled to the second differential input port pair;

wherein the first pMOSFETs of the first and third differential pairs each have drains connected to each other;

wherein the second pMOSFETs of the first and third differential pairs each have drains connected to each other;

wherein the first nMOSFETs of the second and fourth differential pairs each have drains connected to each other; and wherein the second nMOSFETs of the second and fourth differential pairs each have drains connected to each other.

* * * * *

UNITED STATES PATENT AND TRADEMARK OFFICE
CERTIFICATE OF CORRECTION

PATENT NO. : 6,628,168 B2  Page 1 of 1
DATED : September 30, 2003
INVENTOR(S) : Martin et al.

It is certified that error appears in the above-identified patent and that said Letters Patent is hereby corrected as shown below:

Column 2,
Lines 11, 30, 32, 38 and 39, delete "1A and 1A", insert -- 1A and 1B --.

Signed and Sealed this

Third Day of February, 2004

JON W. DUDAS
*Acting Director of the United States Patent and Trademark Office*